United States Patent [19]
Chung

[11] Patent Number: 5,943,575
[45] Date of Patent: Aug. 24, 1999

[54] METHOD OF FORMING SEMICONDUCTOR DEVICE

[75] Inventor: Shin Young Chung, Chungcheongbuk-do, Rep. of Korea

[73] Assignee: LG Semicon Co., Ltd., Chungcheongbuk-Do, Rep. of Korea

[21] Appl. No.: 09/160,194

[22] Filed: Sep. 25, 1998

[30]     Foreign Application Priority Data

May 6, 1998 [KR]  Rep. of Korea ...................... 98-16190

[51] Int. Cl.⁶ ................................................. H01L 21/336
[52] U.S. Cl. ........................ 438/300; 438/264; 438/305; 438/430; 438/589
[58] Field of Search .................................... 438/217, 218, 438/221, 222, 259, 263, 264, 270, 287, 289, 294, 296, 300, 301, 303, 305, 306, 405, 412, 413, 424, 428, 429, 430, 437, 444, 524, 589, 592, 595, 626, 692

[56]                References Cited

U.S. PATENT DOCUMENTS

| 5,296,392 | 3/1994 | Grula et al. ............................. 438/429 |
| 5,575,885 | 11/1996 | Hirabayashi et al. .................. 438/692 |
| 5,691,215 | 11/1997 | Dai et al. ................................ 438/296 |
| 5,702,976 | 12/1997 | Schuegraf et al. ..................... 438/424 |
| 5,741,740 | 4/1998 | Jang et al. .............................. 438/424 |
| 5,786,229 | 7/1998 | Park ........................................ 438/429 |
| 5,817,566 | 10/1998 | Jang et al. .............................. 438/424 |
| 5,872,043 | 2/1999 | Chen ....................................... 438/424 |

OTHER PUBLICATIONS

S. Shishiguchi, et al. "Boron Implanted Shallow Junction Formation By High–Temperature/Short–Time/High–Ramping–Rate(400°C/sec)RTA",*1997 Symposium on VLSI Technology Digest of Technical Papers*, pp. 89–90, 1997.

*Primary Examiner*—Charles Bowers
*Assistant Examiner*—Jack Chen
*Attorney, Agent, or Firm*—Morgan, Lewis & Bockius LLP

[57]                ABSTRACT

A method for fabricating a semiconductor device, including the steps of providing a semiconductor substrate of a first conductivity type, defining a channel region and source/drain regions in the semiconductor substrate and etching the semiconductor substrate in the source/drain regions to a depth, forming an insulating film on a surface of the semiconductor substrate and a first semiconductor layer on the insulating film, etching the first semiconductor layer and the insulating film to expose the semiconductor substrate in the channel region, forming a second semiconductor layer on an entire surface of the semiconductor substrate and the first semiconductor layer, forming a gate insulating film on the second semiconductor layer, forming a gate electrode on the gate insulating film over the channel region, and forming impurity regions of a second conductivity type in the first and second semiconductor layers on both sides of the gate electrode.

12 Claims, 7 Drawing Sheets

METHOD OF FORMING SEMICONDUCTOR DEVICE

BACKGROUND OF THE INVENTION

1. Field of the Invention

The present invention relates to a semiconductor device and a method for fabricating the same, which can improve performances of the semiconductor device.

2. Discussion of the Related Art

An MOS(Metal Oxide Semiconductor Structure), in which a silicon oxide film having a good insulating property is formed on a surface of a silicon before forming electrodes thereon, brings about innovated improvement in performance and fabrication of transistors. In the MOS, there are pMOS(p channel MOS), nMOS(n channel MOS) and CMOS. Though pMOS devices are used mostly initially which has a low power consumption and relatively easy process control in fabrication of an integrated device, nMOS devices became popular as a device speed is regarded important since a mobility of an electron is about 2.5 time higher than a mobility of a hole. As the CMOS device is featured in its low power consumption despite of its complicacy in view of a packing density and fabrication process compared to pMOS or nMOS devices, the nMOS is used in a memory of a semiconductor device while the CMOS is used in the periphery. For a higher device packing density and faster operation, a size of the MOS device, particularly, a length of channel has been reduced. As a result, since, as a generally used power, 5 v is applied as before though a distance between source and drain regions is reduced, a field intensity in the MOS device is increased as much. As the channel length is shortened further for a higher density device packing, a carrier, obtaining high energy from the above field during the carrier flows from the source to channel and obtaining a temperature significantly higher than a lattice around it when it reaches to the drain already, causes impact ionization. Since electrons are more susceptible to the impact ionization than holes, it causes a greater problem in the nMOS device rather than in the nMOS device. Of pairs of electrons and holes produced from such a carrier impact, while the electrons are attracted toward a drain, an n type impurity region in case of the nMOS device, the holes flow toward a substrate, a p type impurity doped region, which flow of holes forms a substrate current. And, since a portion of holes also flow toward the source, biasing a pn junction in a orderly direction and causing a more flow of current by action of an npn transistor, the impact ionization is occurred the more, which increases the drain current the more. At the end, the carriers in the channel is accelerated to have an energy higher than a barrier between the substrate and the gate oxide by a strong field around the drain, to become hot electrons(thermal electrons) and to be injected into the gate oxide film. The injected electrons are called "channel hot electrons". The electrons or holes injected thus into the gate oxide film are trapped in the gate oxide film and produces an energy level at an interface between the substrate and the gate oxide film, thereby causing problems of a changed threshold voltage or a dropped mutual conductance. The aforementioned phenomena, called hot carrier effects, is caused by a strong field generated in a pinch off region near the drain. In order to improve such problems, an MOS transistor of an LDD (Lightly Doped Drain) is suggested, in which a low concentration layer with a moderate impurity concentration profile is formed between the drain and the channel, for reducing the strong field and improving the hot carrier effects.

An LDD structure has a self-aligned lightly doped impurity region(LDD region) between the channel region and heavily doped impurity regions(source/drain regions) on both sides of the channel region. This LDD region spread out the strong field near a drain junction, preventing the rapid acceleration of the carriers from the source even under a high applied voltage, thereby solving the unstableness of current caused by the hot carrier. However, as the LDD region has a low concentration(about $\frac{1}{1000}$) in comparison to a heavy concentration of the source/drain regions, a resistance in the region acts as a parasitic resistance, that reduces a driving current. In conclusion, if the concentration of the LDD region is increased, a substrate current is increased increasing the hot carrier effect, if the concentration is decreased, the driving current is decreased due to the parasitic resistance. Therefore, the concentration in the LDD region should be easy to control and set to be high as far as possible. One of methods meeting the above requirement which is used widely is a method in which LDD regions are formed on both sides of a gate electrode by injecting ions using the gate electrode as mask, sidewall spacers of oxide are formed at sides of the gate electrode, and ion are injected using the sidewall spacers and the gate electrode, to form the heavily doped source/drain regions. An MOS transistor of LDD formed in the aforementioned method has lightly doped regions not only in the drain region, but also in the source region. Besides, there is an MOSFET device which prevents the punch through by forming a pocket region in a form bounding the lightly doped regions of source/drain at a portion deep near the channel started both from the source/drain regions toward the channel.

A background art method for fabricating an MOS transistor in a semiconductor device will be explained with reference to the attached drawings. FIGS. 1a~1g illustrates sections showing the steps of a background art method for fabricating an MOS transistor in a semiconductor device.

Referring to FIG. 1a, a well region 2 is formed using a generally used process in a semiconductor substrate 1. As shown in FIG. 1b, an isolation region(field regions) is defined, and an isolation film 3 is formed on the semiconductor substrate 1 in the isolation region. As shown in FIG. 1c, channel ions are injected under a surface of the well region 2 in the semiconductor substrate 1 for adjusting a threshold voltage $V_T$. As shown in FIG. 1d, a gate oxide film 4 is formed on an entire surface of the isolating film 3 inclusive of the semiconductor substrate 1. As shown in FIG. 1e, a gate electrode 5 is formed on the gate oxide film 4. There are a refractory metal film 6 and a cap gate oxide film 7 over the gate electrode 5. The gate electrode 5 has a width becoming the narrower as the semiconductor device is packed the higher. As shown in FIG. 1f, the gate electrode 5 is used as a mask in lightly doping portions of the well regions 2 on both sides of the gate electrode 5 with impurities of a conductivity opposite to a conductivity of the well region 2, to form LDD regions 8. Then, sidewall spacers 9 are formed at sides of the cap gate oxide film 7, the refractory metal film 6 and the gate electrode 5. A portion of the well region 2 between the LDD regions 8 is a channel region 10. As shown in FIG. 1g, the gate electrode 5 and the sidewall spacers 9 are used as masks in heavily doping portions of the well region 3 on both sides of the sidewall spacers 9 with impurities of a conductivity opposite to a conductivity of the well region 3, to form source/drain regions 11.

However, the background art method for fabricating an MOS transistor in a semiconductor device has the following problems.

First, the incapability of preventing occurrence of a leakage current from source/drain regions to the well region due to the source/drain regions formed in direct contact with the well region degrades a reliability as a transistor in a semiconductor device.

Second, the generation of parasitic capacitance at an interface of the well region and the source/drain regions due to a difference of dopants drops a driving speed of the transistor.

Third, the incapability of prevention of punch through between a substrate bulk under the channel region and the source/drain regions as a length of the channel is shortened in proportion to the advance of device integration causes problems, such as degradation of memory.

Fourth, the depth of doping could not be controlled perfectly in the doping of the source/drain regions.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same which can prevent leakage currents, parasitic capacitance and punch through, for preventing degradation of device performance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a semiconductor substrate of a first conductivity type having a projection, an insulating film formed on the semiconductor substrate excluding a top of the projection, a semiconductor layer formed on the projection of the semiconductor substrate inclusive of the insulating film, impurity regions of a second conductivity type formed in the semiconductor layer on both sides of the projection, a gate insulating film formed on the semiconductor layer, and a gate electrode formed on the gate insulating film over the projection.

In other aspect of the present invention, there is provided a method for fabricating a semiconductor device, including the steps of (1) providing a semiconductor substrate of a first conductivity type, (2) defining a channel region and source/drain regions and etching the semiconductor substrate in the source/drain regions to a prescribed depth, (3) forming an insulating film 24 on a surface of the semiconductor substrate 21 and a first semiconductor layer 25 on the insulating film 24, (4) etching the first semiconductor layer 25 and the insulating film 24 to expose the semiconductor substrate 21 in the channel region 29, (5) forming a second semiconductor layer 26 on an entire surface of the semiconductor substrate 21 and the first semiconductor layer 25, (6) forming a gate insulating film 30 on the second semiconductor layer 26, (7) forming a gate electrode 31 on the gate insulating film 30 over the channel region 29, and (8) forming impurity regions 36 of a second conductivity type in the first, and second semiconductor layers 25 and 26 on both sides of the gate electrode 31.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
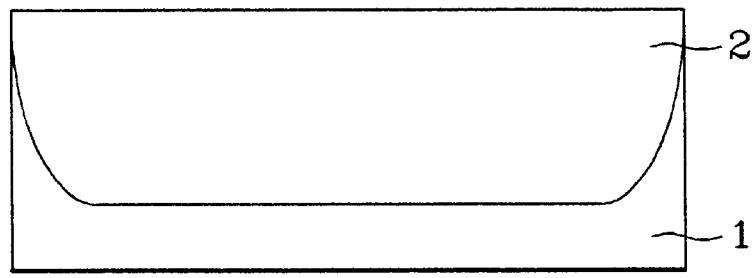
FIGS. 1a~1g illustrates sections showing the steps of a background art method for fabricating an MOS transistor in a semiconductor device.
Figure 1B:
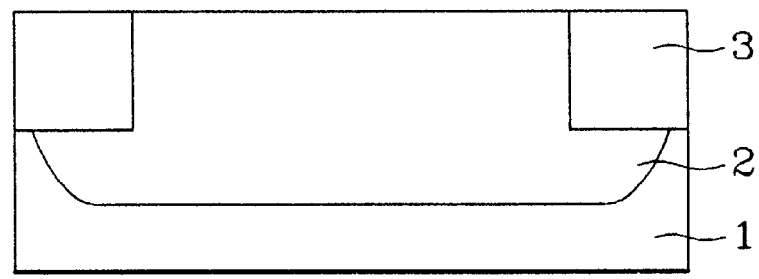
Figure 1C:
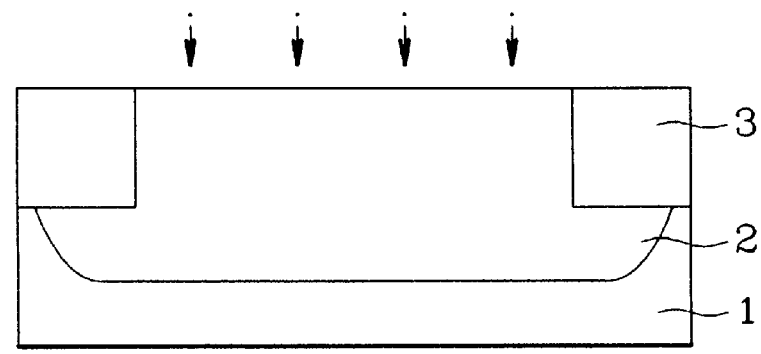
Figure 1D:
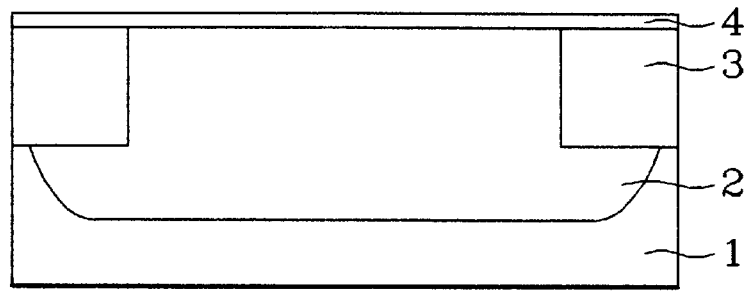
Figure 1E:
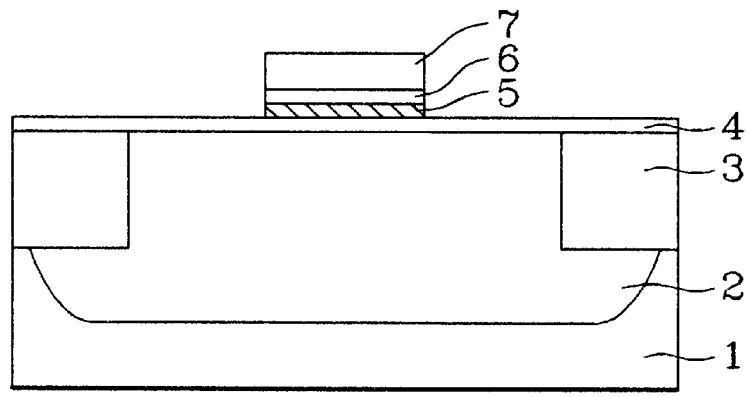
Figure 1F:
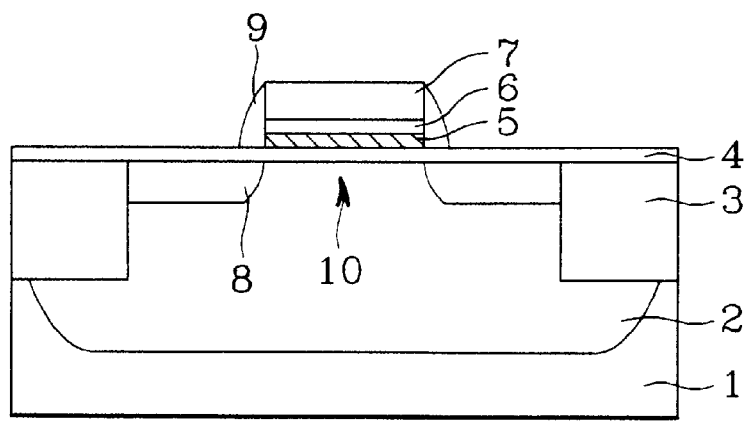
Figure 1G:
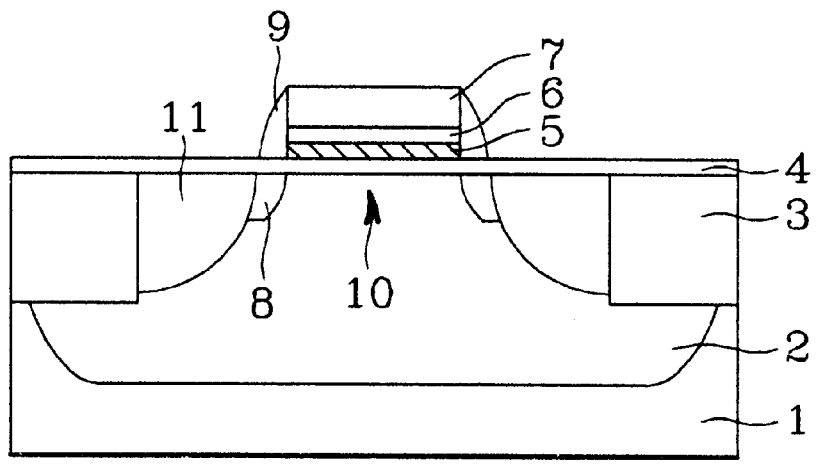
Figure 2:
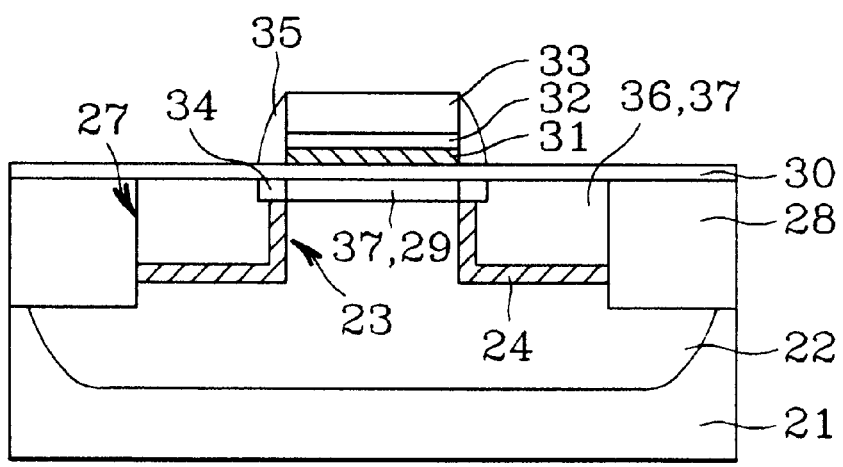
FIG. 2 illustrates a section of an MOS transistor in a semiconductor device in accordance with a preferred embodiment of the present invention; and, FIGS. 3a~3k illustrates sections showing the steps of a method for fabricating an MOS transistor in a semiconductor device in accordance with a preferred embodiment of the present invention.

Reference will now be made in detail to the preferred embodiments of the present invention, examples of which are illustrated in the accompanying drawings. FIG. 2 illustrates a section of an MOS transistor in a semiconductor device in accordance with a preferred embodiment of the present invention.

Referring to FIG. 2, the MOS transistor in a semiconductor device in accordance with a preferred embodiment of the present invention includes a semiconductor substrate 21 of a first conductive type having a projection 23, an insulating film 24 formed on the semiconductor substrate 21 excluding a top surface of the projection 23, a semiconductor layer 37 formed on the projection 23 of the semiconductor substrate 21 inclusive of the insulating film 24, impurity regions of a second conductivity 36 formed in the semiconductor layer 37 on both sides of the projection 23, a gate insulating film 30 formed on an entire surface of the semiconductor layer 37, and a gate electrode 31 formed on the gate insulating film 30 on the projection 23. The insulating film 24 is inclusive of one or more than one of an oxide film and a nitride film and formed to a thickness less than a height of the projection 23. The semiconductor layer 37 is formed of one or more than one of a polysilicon layer or epitaxially grown layer. And, the portion of the semiconductor layer 37 on the projection 23 is a channel region 29, and the impurity regions 36 of the second conductivity type are source/drain regions. There are isolating films 28 each formed in a trench 27 at a side of each of the impurity regions 36 of the second conductivity type opposite to the channel region 29. And, there are LDD regions 34 of the second conductive type formed at interfaces between the channel region 29 and portions of the semiconductor layer 37 on both sides of the projection 23, a refractory metal film 32 and a cap gate insulating film 33 on the gate electrode 31, and sidewall spacers 37 at sides of the cap gate insulating film 33, the refractory metal film 32 and the gate electrode 31. The gate electrode 31 is formed on the gate insulating film 30 over the projection 23.

FIGS. 3a~3k illustrates sections showing the steps of a method for fabricating an MOS transistor in a semiconductor device in accordance with a preferred embodiment of the present invention.

Figure 3A:
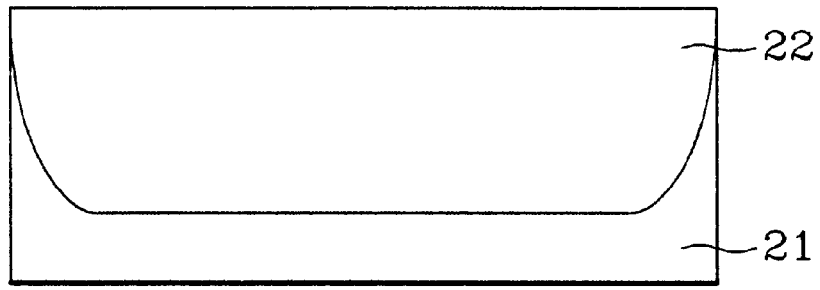
Figure 3B:
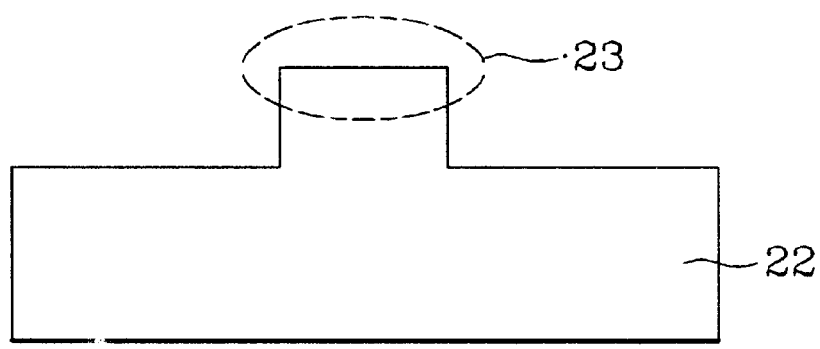
Figure 3C:
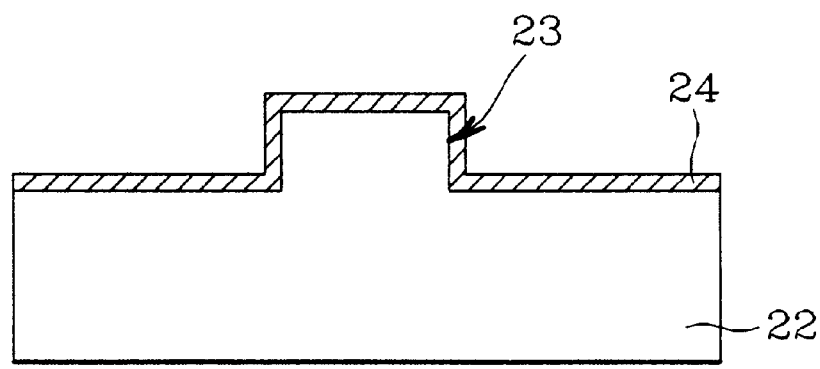
Figure 3D:
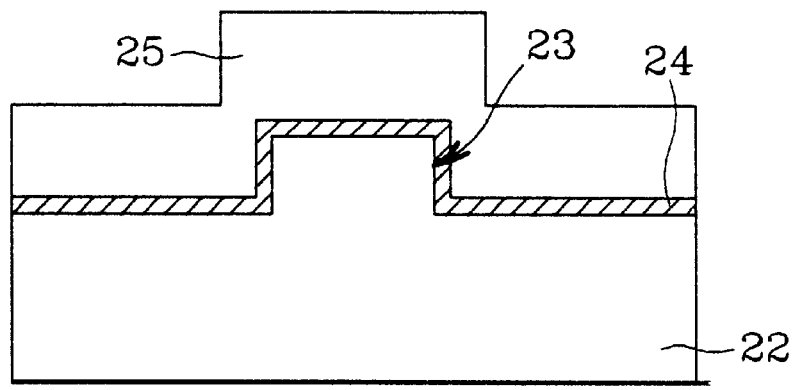
Figure 3E:
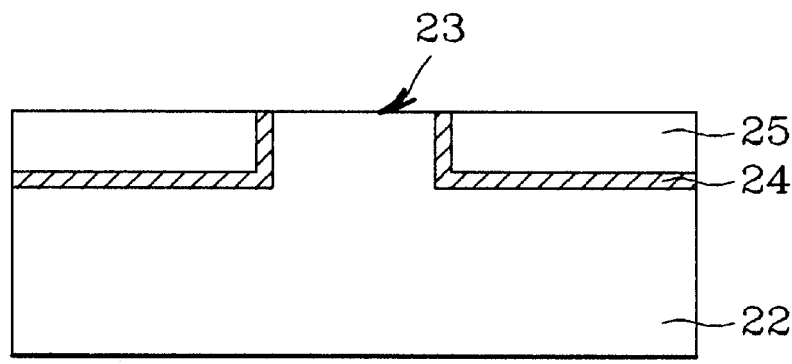
Figure 3F:
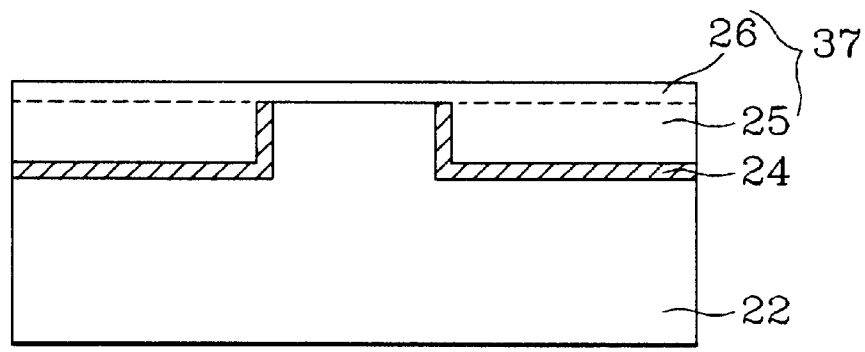
Figure 3G:
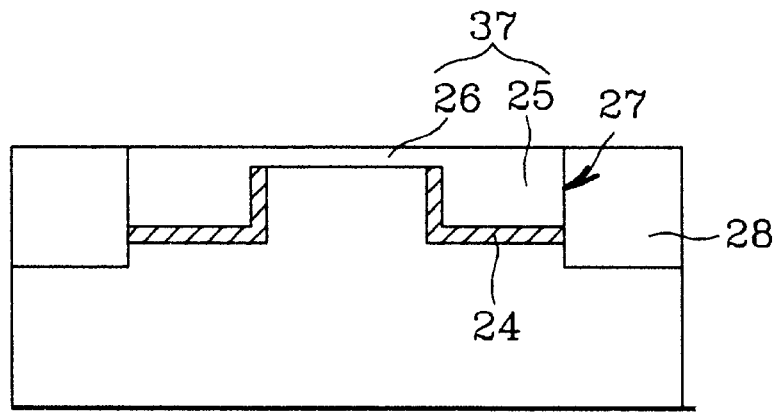
Figure 3H:
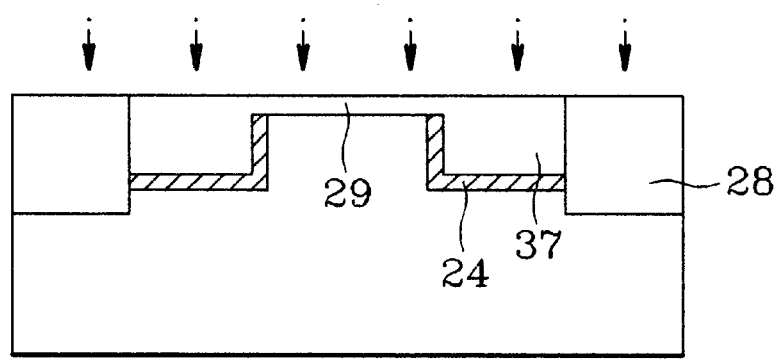
Figure 3I:
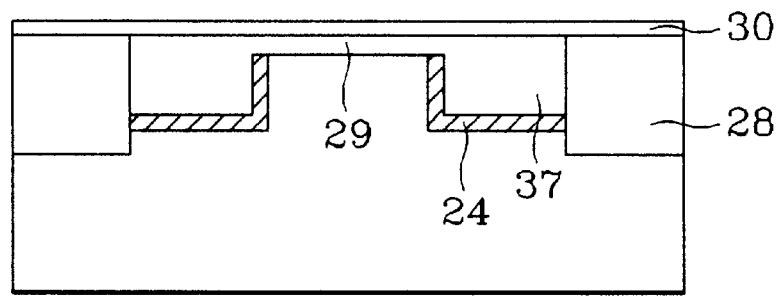
Figure 3J:
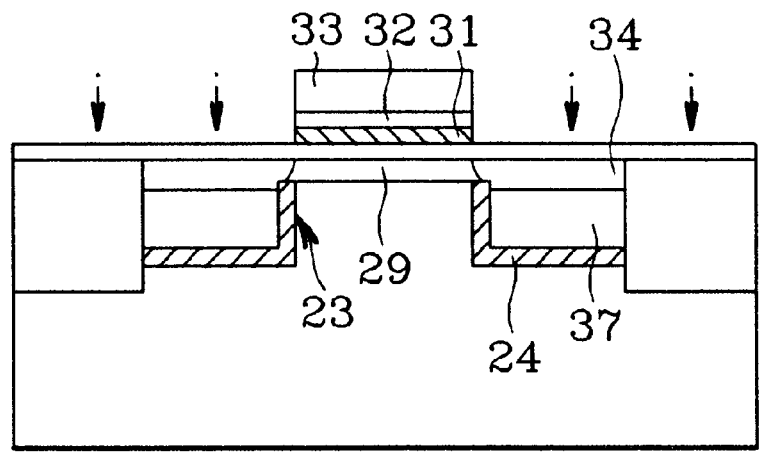
Figure 3K:
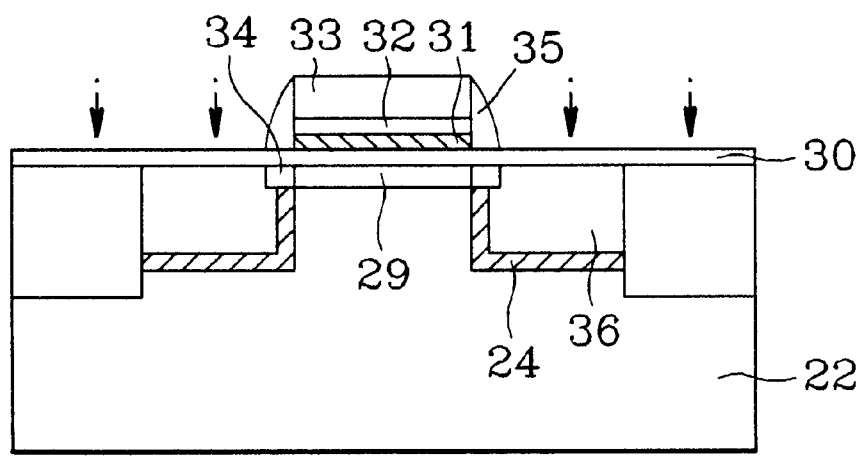

Referring to FIG. 3a, the method starts with forming a well 22 of a first conductive type on a semiconductor using a generally used process. As shown in FIG. 3b, a channel region is defined, and the semiconductor substrate 21 except the channel region is removed to a depth, to form a projection 23 of the semiconductor substrate 21. In this instance, the semiconductor substrate 21 is etched to a depth ranging 1500~5000 Å, that is the projection 23 has a height of 1500~5000 Å, which is equal to the junction depth of the source/drain plus a thickness of an insulating film 24 to be formed in a following step. As shown in FIG. 3c, the insulating film 24 is formed on a surface of the semiconductor substrate 21 inclusive of the projection 23. The insulating film 24 is inclusive of one or more of an oxide film and a nitride film to a thickness of 500~3500 Å, i.e., thinner than the thickness of the projections 23. As shown in FIG. 3d, a first semiconductor layer 25 is formed of polysilicon on the insulating film 24. As shown in FIG. 3e, the first semiconductor layer 25 and the insulating film 24 are subjected to CMP(Chemical Mechanical Polishing) until top of the projection 23 is exposed, leaving the semiconductor layer 25 only in regions other than the channel region and isolating the first semiconductor layer 25 from the semiconductor substrate 21 by means of the insulating film 24. As shown in FIG. 3f, a second semiconductor layer 26 is formed of polysilicon on the first semiconductor layer 25 inclusive of the projection 23, to form a semiconductor layer 37 consists of the first and second semiconductor layers 25 and 26. Other than the aforementioned method of forming the semiconductor layer 37 by forming the first, and second semiconductor layer 25 and 26 of polysilicon, the semiconductor layer 37 may be formed by epitaxial growth of the semiconductor layer 25 and the semiconductor substrate 21 in the well region 22. As shown in FIG. 3g, isolation regions are defined and the semiconductor substrate 21 inclusive of the second, and first semiconductor layers 26 and 25 and the insulating film 24 is etched to form trenches 27, in which insulating material films are formed to form isolating films 28 of an STI(Shallow Trench Isolation) structure. As shown in FIG. 3h, channel ions are injected into a surface of the semiconductor layer 37 to form a channel region 29. As shown in FIG. 3i, a gate insulating film 30 is formed on an entire surface of the substrate inclusive of the semiconductor layer 37. As shown in FIG. 3j, a polysilicon layer, a refractory metal film 32 and a cap gate insulating film 33 are formed on the gate insulating film 30 in succession and are subjected to selective patterning(photolithography+etching) to leave the cap gate insulating film 33, the refractory metal film 32 and the polysilicon layer only on the gate insulating film 30 on the projection 23, to form a gate electrode 31. Then, the gate electrode 31 is used as mask in lightly doping portions of the semiconductor layer 37 on both sides of the gate electrode 31, to form LDD regions 34 of a conductivity opposite to the conductivity of the first conductivity well region 22. As shown in FIG. 3k, sidewall spacers 35 are formed at sides of the cap gate insulating film 33, the refractory metal film 32 and the polysilicon layer. Then, the sidewall spacers 35 and the gate electrode 31 are used as masks in heavily doping portions of the semiconductor layer 37 on both sides of the sidewall spacers 35 with impurities of a conductivity type opposite to the first conductive type well region 22, to form second conductivity type impurity regions 36. In this instance, the insulating film 24 limits a depth of injection of the second conductivity type impurity ions. As explained in association with FIGS. 3b and 3c, the depth of the second conductivity type impurity regions 36, ranging 1000~4500 Å. can allow for a junction depth required for a DRAM over 1 Gb(Giga bit) class.

The semiconductor device and the method for fabricating the same of the present invention have the following advantages.

First, the pocket structure in which the heavily doped source/drain regions are bound by the insulating film prevents occurrence of leakage current flowing from the heavily doped source/drain regions to the well region, thereby providing a semiconductor device of a high reliability.

Second, the prevention of parasitic capacitances by forming the insulating film at an interface between the well region and the source/drain regions can improve a driving speed of a transistor.

Third, the capability of preventing punch through between the source/drain regions by the insulating film formed to bound the source/drain regions even if the length of the channel region is shortened due to a high integration can improve a reliability of the transistor.

Fourth, the perfect controllability of the ion injection depth in the impurity ion injection for forming the source/drain regions by means of the pocket structured insulating film allows to provide a highly reliable semiconductor device and a method for fabricating the same.

Fifth, as the channel region is not isolated from the semiconductor substrate different from the transistor of an SOI structure, floating of the substrate can be prevented, thereby preventing degradation of device performances, such as unstable threshold voltage.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising the steps of:
   (1) providing a semiconductor substrate of a first conductivity type;
   (2) defining a channel region and source/drain regions in the semiconductor substrate and etching the semiconductor substrate in the source/drain regions to a depth;
   (3) forming an insulating film on a surface of the semiconductor substrate and a first semiconductor layer on the insulating film;
   (4) etching the first semiconductor layer and the insulating film to expose the semiconductor substrate in the channel region;
   (5) forming a second semiconductor layer on an entire surface of the semiconductor substrate and the first semiconductor layer;
   (6) forming a gate insulating film on the second semiconductor layer;
   (7) forming a gate electrode on the gate insulating film over the channel region; and,
   (8) forming impurity regions of a second conductivity type in the first, and second semiconductor layers on both sides of the gate electrode.

2. A method as claimed in claim 1, wherein, in the step (2), the semiconductor substrate is etched to a depth of 1500~5000 Å.

3. A method as claimed in claim 1, wherein the insulating film 24 includes an oxide film and a nitride film.

4. A method as claimed in claim 1, wherein the insulating film is formed to a thickness of 500~3500 Å.

5. A method as claimed in claim 1, wherein the first, and second semiconductor layers are formed of an identical material.

6. A method as claimed in claim 1, wherein the first, and second semiconductor layers are formed of polysilicon.

7. A method as claimed in claim 1, wherein the first semiconductor layer and the insulating film are subjected to chemical mechanical polishing.

8. A method as claimed in claim 1, wherein a depth of etching in the step (2) is equal to a junction depth of the source/drain regions plus a thickness of the insulating film formed in step 3.

9. A method as claimed in claim 1, wherein the semiconductor substrate and the first semiconductor layer are epitaxially grown to form the second semiconductor layer.

10. A method as claimed in claim 1, wherein, after the second semiconductor layer is formed, the second semiconductor layer is injected of channel ions.

11. A method as claimed in claim 1, further including the step of forming LDD regions between the channel region and the source/drain regions.

12. A method as claimed in claim 1, wherein the step (8) includes the steps of:

lightly doping the first and second semiconductor layers on both sides of the gate electrode with impurity ions of a second conductivity type, to form LDD regions, forming sidewall spacers at sides of the gate electrode, and using the sidewall spacers and the gate electrode in heavily doping the first and second semiconductor layers with impurity ions of the second conductivity type.

\* \* \* \* \*